United States Patent [19]

Lee

[11] 4,398,154
[45] Aug. 9, 1983

[54] READ CHANNEL GATE GENERATOR WITH SELF-ADJUSTING PULSE WIDTH COMPENSATOR

[75] Inventor: Patrick S. Lee, Campbell, Calif.

[73] Assignee: Sperry Corporation, New York, N.Y.

[21] Appl. No.: 252,763

[22] Filed: Apr. 10, 1981

[51] Int. Cl.³ .............................................. H03K 5/06
[52] U.S. Cl. ..................................... 328/58; 307/350; 307/362; 307/267; 328/117
[58] Field of Search ............... 307/265, 267, 350, 351, 307/362, 606, 517, 518; 328/55, 58, 111, 112, 115, 117

[56] References Cited

U.S. PATENT DOCUMENTS

| | | | |
|---|---|---|---|
| 3,426,159 | 2/1969 | Mann | 307/267 |
| 3,659,211 | 4/1972 | Norton | 328/58 |
| 4,135,160 | 1/1979 | Gagliani | 328/58 |

Primary Examiner—John Zazworsky

Attorney, Agent, or Firm—Eugene T. Battjer; Linval B. Castle

[57] ABSTRACT

A gate generator circuit for receiving a pulse type input data signal, wherein the locations of the pulse peaks are representative of the data, includes a comparator for comparing voltage levels of the pulses of the input signal with a reference voltage applied to the comparator so as to generate rectangular pulses, the reference voltage being varied in a controlled manner to assure that each rectangular pulse has at least a prescribed minimum time duration. A tapped delay line and logic circuits coupled to selected taps thereof respond to the rectangular pulses to produce a gating pulse signal by symmetrically expanding the rectangular pulses if the pulse widths thereof are less than or equal to a predetermined time duration and by transmitting the rectangular pulses unchanged in pulse widths if the pulse widths thereof are greater than the predetermined time duration.

20 Claims, 10 Drawing Figures

PULSE WIDTH OF $f_B(t)$ AT THE THRESHOLD LEVEL

READ CHANNEL GATE GENERATOR WITH SELF-ADJUSTING PULSE WIDTH COMPENSATOR

BACKGROUND OF THE INVENTION

1. Field of the Invention

This invention relates to a circuit for producing gating pulses in response to a pulse type input signal and more particularly to a circuit in which the gating pulses are produced only if the peaks of the input signal exceed a predetermined threshold level.

2. Description of the Prior Art

In a typical data readback circuit of a disk drive storage device, a transducer produces a pulse type readback signal in response to binary digital data recorded as transitions in a magnetic medium such as a magnetic disk of the disk storage device. The locations of the peaks in the readback signal are representative of the data. However, since the readback signal is also likely to contain peaks produced by spurious sources such as noise, the readback signal is usually applied to a detector circuit which processes the readback signal to produce a data representative signal devoid of noise. Noise is undesirable because it may cause shifting of the data peaks in the readback signal and thereby adversely affect the accuracy of detecting the data. The detector circuit typically comprises a peak detecting channel coupled in parallel with a gate generator channel. U.S. Pat. No. 4,081,756 issued Mar. 28, 1978, to Price et al discloses a dual channel detector circuit which functions in the manner of and which includes a gate generator circuit of the kind to which the present invention relates. As disclosed in the Price et al Patent, the gate generator (amplitude detector) circuit functions to produce gating pulses in response to each pulse of the read signal having a peak amplitude exceeding a predetermined threshold level. The threshold level is usually chosen to be the minimum amplitude level expected for a peak representative of data so as to preclude producing gating pulses in response to noise pulses having amplitudes less than the threshold level. The gating pulses are then applied to a gate circuit along with peak detected signals produced by the peak detector circuit. Since the gate generator produces gating pulses only in response to and in time coincidence with data pulses, noise pulses do not pass through the gate circuit. Detection errors can still occur, however, because the dual channel detector circuit includes circuits operating in parallel with one another and therefore circuit noise and other operating uncertainties in the respective circuits of each channel introduce timing errors which are likely to result in the detected peaks representative of data in the signal being randomly shifted out of time coincidence with its corresponding gating pulse. Accordingly, the pulse width (time duration) of each gating pulse must be sufficiently wide to compensate for timing errors in order to preclude detection errors. But the gating pulse must also be limited in pulse width to preclude detected noise peaks from being gated through the detector circuit and included in the data representative signal.

Gate generator circuits generally operate to produce gating pulses of either fixed or variable width time durations. In the case of fixed-width gate generator circuits, the time duration of a gating pulse is fixed to be sufficiently wide for detecting a prescribed nominal data pulse of the readback signal. Typically, an equalizer circuit and an automatic gain control (AGC) circuit, which are well known in the art, are used to process the readback signal to insure that pulses applied to the input of the dual channel detector circuit all have symmetrical waveshapes and amplitudes substantially equal the prescribed nominal level. However, in modern disk drive systems having a plurality of disks and associated transducers, the peak amplitudes of the readback signal may vary greatly because of variations in operating characteristics from transducer to transducer or variations in recording characteristics from disk to disk. Since AGC circuits cannot instantaneously respond to initial amplitude variations of the readback signal, pulses deviating from the nominal amplitude are likely to be produced for some transient period each time data is read back from a different transducer or disk than that used previously. Problems arise when a readback pulse is substantially greater or less than the nominal pulse. In a fixed-width gate generator, the gating pulse starts when the amplitude of the readback pulse applied thereto reaches the gate generator threshold and lasts for a predetermined (fixed) time interval so that the peak of a nominal readback pulse coincides with the center of its associated gating pulse. Therefore, when a larger than nominal readback pulse is applied to the input of the detection circuit, the detected peak of such pulse occurs after the midpoint (towards the trailing end) of the associated gating pulse. This result is undesirable because the aforementioned timing errors may further delay the peak so that the peak is shifted outside the fixed width of the associated gating pulse thereby resulting in loss of data. Alternatively, when a smaller than nominal pulse is applied to the input of the detector circuit, the detected peak of such small pulse occurs before the midpoint of its correspondingly produced gating pulse. Such is also likely to result in lost data because the timing errors may further advance the peak of the small pulse so that the peak is shifted outside the fixed width of its associated gating pulse.

However, if the gating pulse came on upon the crossing of the gate generator threshold and remained on until the amplitude of the readback pulse fell below the threshold, the problem described above would not occur. In the case of a variable-width gate generator circuit, the time duration of each gating pulse is typically dependent upon the time duration that the readback signal pulse exceeds a predetermined threshold level. Accordingly, a larger than nominal or a smaller than nominal readback signal pulse will result respectively in a larger or smaller than nominal gating pulse. In the absence of timing errors, the pulse peak would coincide with the midpoint of the associated gating pulse. Timing errors generally would not cause lost data problems in the situation involving larger than nominal pulses in the readback signal because the correspondingly large gating pulses produced and associated with such pulses are likely sufficiently wide to accommodate for the shifting caused by timing errors. However, in the case of smaller than nominal pulses in the readback signal timing errors are still likely to result in lost data because the durations of the associated gating pulses are too small to accommodate the relative shifting of the detected peaks.

Therefore, while the two types of gate generator circuits described above are satisfactory for readback signal pulses having a prescribed nominal waveshape, there is a need for improvement in the case where the readback signal pulses are substantially smaller than the nominal pulse.

SUMMARY OF THE INVENTION

The limitations of the above described prior art gate generator circuits are overcome by a gate generator circuit made in accordance with the principles of the present invention. The preferred embodiment of the present invention includes a variable-width gate generator circuit which responds to the pulses of a readback signal to produce gating pulses each having a time duration equal to the time that the respective readback signal pulse exceeds a predetermined threshold level. If such readback signal pulse at the threshold level has a time duration less than or equal to a first time duration and greater than a second time duration, the gating pulse is produced by expanding the pulse symmetrically by a first time expansion interval. If such readback signal pulse at the threshold level has a time duration less than or equal to the second time duration, the gating pulse is produced by expanding the pulse symmetrically by a second time expansion interval. The symmetrical expansion feature of the present invention permits each detected peak of the readback signal to be located substantially within the associated gating pulse and thereby overcomes the problems discussed above concerning the prior art fixed-width gate generator circuit wherein noise and timing errors may result in lost data because the larger and smaller than nominal readback signal pulses have their peaks occuring respectively after and before the midpoint of the associated (fixed width) gating pulses. The symmetrical expansion feature of the present invention also overcomes the problem discussed above concerning the prior art variable-width gate generator circuit wherein the gating pulse is too small to accommodate shifting of the peak detected signal.

Briefly described, the preferred embodiment of a gate generator circuit embodying the principles of the present invention comprises an amplitude detection circuit coupled to a pulse width expander circuit. The amplitude detection circuit receives the pulse type input signal representative of data and produces in response thereto a rectangular pulse signal having pulses with time durations equal to the time durations that the respective input pulses exceed a predetermined threshold level. The pulse width expander circuit is coupled to receive the rectangular signal from the detection circuit for producing a gating pulse signal. In response to a rectangular pulse signal having pulse widths greater than the predetermined first time duration, the expander circuit transmits such rectangular pulses unchanged in pulse width as the gating pulse signal. In response to a rectangular pulse signal having pulse widths less than or equal to the predetermined first time duration and greater than the predetermined second time duration, the expander circuit produces a gating pulse signal by symmetrically expanding such rectangular pulses by the prescribed first time expansion interval. Finally, in response to a rectangular pulse signal having pulse widths less than or equal to the predetermined second time duration, the expander circuit produces a gating pulse signal by symmetrically expanding such rectangular pulses by the prescribed second time expansion interval.

A further feature of the present invention is the provision of an integrator circuit incorporated into the amplitude detection circuit. The integrator circuit operates to change abruptly in a prescribed manner the threshold level set in the amplitude detection circuit such that each rectangular pulse produced therefrom has at least a minimum time duration. This arrangement also permits reliable operation of the expander circuit since circuit transients produced in response to a pulse are eliminated before the output gating pulse is produced.

The above described and other features of the present invention will be more fully understood from a reading of the ensuing description of the preferred embodiment given with reference to the appended drawings.

DESCRIPTION OF THE PREFERRED EMBODIMENT

Figure 1:
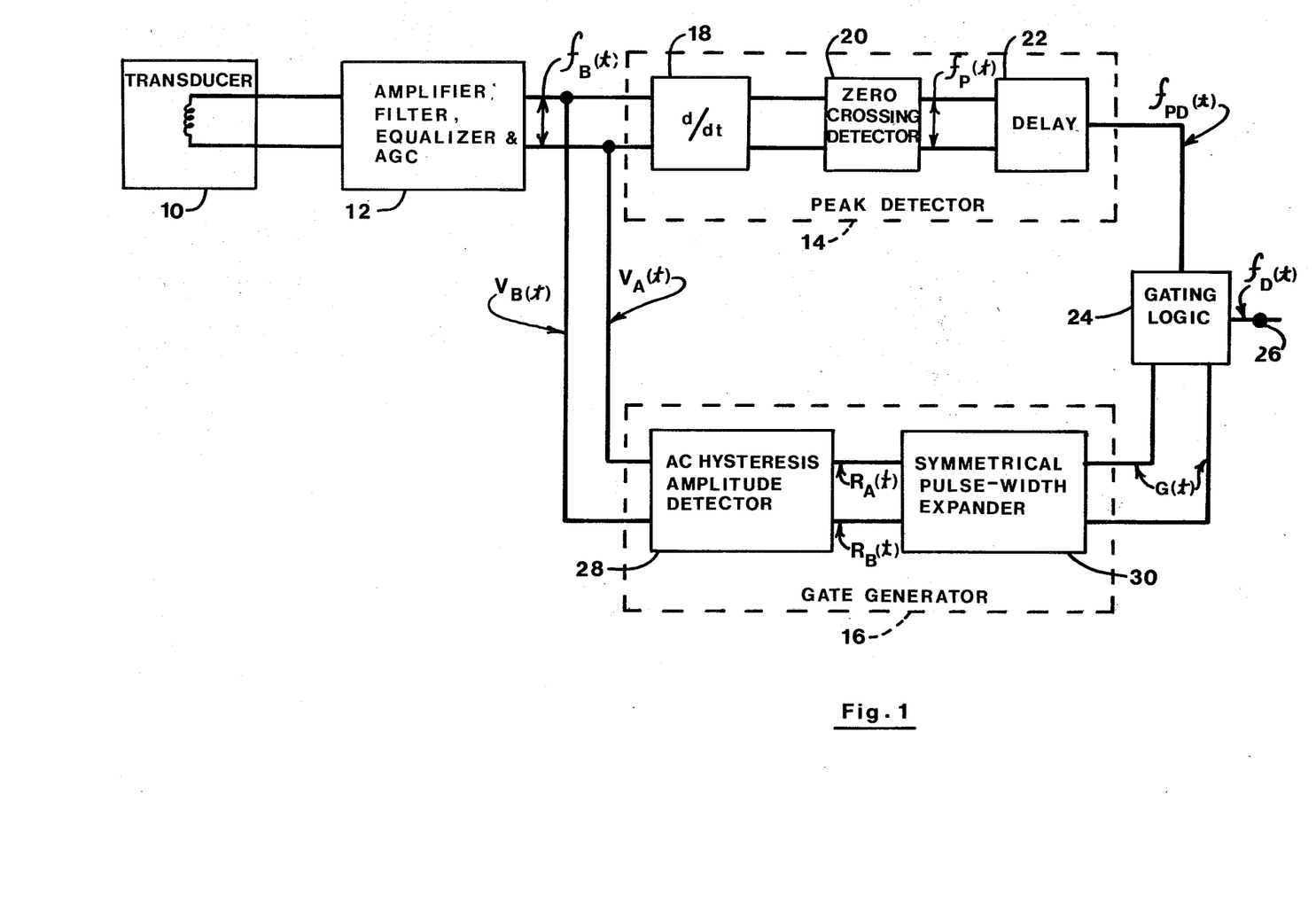
FIG. 1 is a block diagram of a readback circuit which can be used in a digital data magnetic storage system and incorporates a gate generator circuit embodying the principles of the present invention comprising an AC hysteresis amplitude detector and a symmetrical pulse width expander.

An electrical circuit used for reading back binary digital data stored in a magnetic recording medium is depicted in block diagram form in FIG. 1. Transducer 10 detects the recorded data which are magnetic transitions in the magnetic recording medium (not shown in the drawings) and produces in response thereto an electrical signal having amplitude peaks representative of the data. Block 12 includes amplifier, equalizer, filter and automatic gain control (AGC) circuits which operate in conventional manner to produce in response to the electrical signal derived by transducer 10 a pulse type readback signal $f_B(t)$ wherein the pulses are symmetrically shaped and substantially equal in width (time duration) and in peak amplitude with respect to one another. The output of block 12 is then simultaneously applied to each channel of a dual channel detector comprising peak detector 14 as one channel and gate generator 16 as the other channel. Peak detector 14 includes differentiator 18, zero crossing detector 20 and delay network 22, all operating together in a fashion well known in the magnetic recording art to produce signal $f_{PD}(t)$ having pulses representative of the amplitude peaks contained in readback signal $f_B(t)$.

Gate generator 16 made in accordance with the principles of the present invention produces gating pulses G(t) whenever a pulse peak of readback signal $f_B(t)$ exceeds a predetermined threshold level. The threshold level is chosen to be an amplitude level representative of a minimum data pulse amplitude. Delay network 22 is included in peak detector 14 for the purpose of maintaining the relative time coincidence of output signals $f_{PD}(t)$ and G(t). The signal from peak detector 14 is therefore delayed in time in order to match any delay introduced in the gate generator 16. Gating logic 24 is coupled to receive signals $f_{PD}(t)$ and G(t) and produces at output terminal 26 a signal $f_D(t)$ which contains pulses representative of the data transitions stored in the recording medium.

Figure 2A:
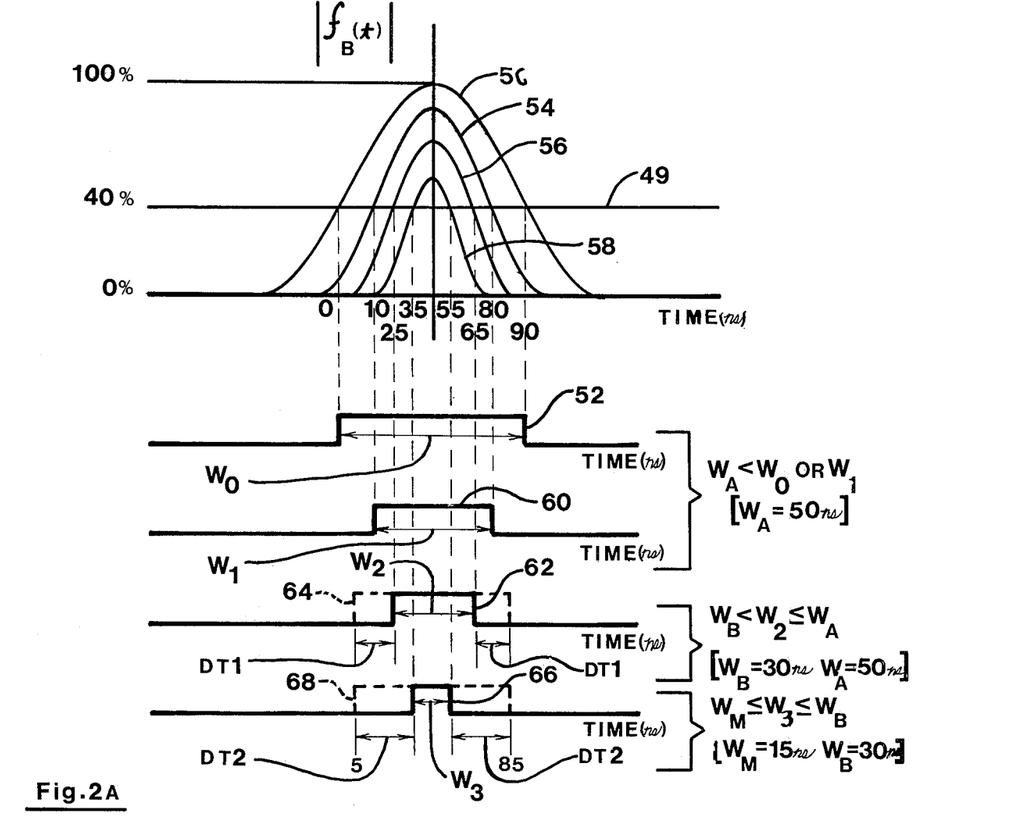
FIG. 2A depicts four pulses of a variable amplitude signal applied to the input of the AC hysteresis amplitude detector included in FIG. 1 and shows the resulting gating pulses produced at the output of the symmetrical pulse width expander of FIG. 1.

As shown in FIG. 1, gate generator 16 comprises AC (alternating current) hysteresis amplitude detector 28 and symmetrical pulse width expander 30. The operation and configuration of these two elements will be discussed in greater detail in conjunction with the subsequent figures. However, before beginning the detailed discussion, FIGS. 2A and 2B should be considered in order to appreciate the overall operation of the gate generator embodiment of the present invention. Included in the following discussion involving FIGS. 2A and 2B will be some quantitative values which serve as illustrative examples to aid in the understanding of the operation of gate generator 16. It should be noted that the gate generator of the present invention is not limited to the illustrative values used in the discussion. With reference to FIG. 2A, the upper plot depicts four waveforms 50, 54, 56 and 58 which are representative of the pulses included in signal $f_B(t)$ produced in response to the recorded data and which are applied to AC hysteresis amplitude detector 28. Amplitude detector 28 includes a conventional amplitude threshold detection circuit which produces signals $R_A(t)$ and $R_B(t)$ each comprising a train of substantially rectangular pulses wherein the lading (positive) edge of each pulse is produced at the instant that a pulse of signal $f_B(t)$ exceeds a predetermined threshold level 49 and the trailing (negative) edge of each pulse is produced at the instant that the pulse of signal $f_B(t)$ becomes less than the predetermined threshold level 49. Threshold level 49 has been advantageously set to a level equal to forty percent of the amplitude of a nominal readback signal pulse in a particular system which has been developed. Pulse 50 is an illustrative nominal readback signal pulse representative of data. Gate generator 16 in response to readback signal pulse 50 produces rectangular pulse 52 which in the illustrative case has a time duration $W_0$ equal to ninety nanoseconds (90 ns) measured at threshold level 49. It should be noted that hereinafter all pulse widths will be referred to the width occurring at threshold level 49. If a plurality of recording disks are used in association with a plurality of transducers, the signals produced by the respective transducers may vary in amplitudes because of variations in recording characteristics from disk to disk and variations in transducer characteristics from transducer to transducer. Pulses 54, 56 and 58 represent three such input pulses of signal $f_B(t)$ varying significantly in amplitude and pulse width.

It has been determined in the illustrative case that a pulse having pulse width less than or equal to 50 ns, denoted as $W_A$, is too small to be used as a gating pulse for signal G(t) because circuit noise and other operating uncertainties are likely to shift the location of the peak of readback signal $f_B(t)$ as detected by peak detector 14 outside the pulse width of such a small pulse. Pulse 54 when applied to the input of amplitude detector 28 results in rectangular pulse 60 which has a pulse width $W_1$ of 70 ns. Since rectangular pulse 60 has width greater than 50 ns, it is of sufficient width to be a gating pulse and accordingly passes unchanged through symmetrical pulse width expander 30 to become a gating pulse of signal G(t).

Pulse 56 when applied to the input of amplitude detector 28 results in rectangular pulse 62 which has a pulse width $W_2$ of 40 ns. In the illustrative case the time duration of pulse 62 is too short for use as a gating pulse. Therefore, expander 30 operates on pulse 62 by displacing both the leading and trailing edges thereof by a first time expansion DT1, which in the present exaple is 20 ns, to produce gating pulse 64. In other words, expander 30 operates to expand symmetrically rectangular pulse 62 in order to produce gating pulse 64 with 80 ns pulse width. It should be noted that if rectangular pulse 62 had a 50 ns pulse width, the resulting gating pulse would have a 90 ns pulse width which is equal to the nominal pulse width.

Pulse 58 when applied to the input of amplitude detector 28 results in rectangular pulse 66 which has a pulse width $W_3$ of 20 ns. Again, in the illustrative case 20 ns is too short an interval to be used as a gating pulse. Therefore, expander 30 operates on pulse 66 to produce gating pulse 68 wherein the leading and trailing edges of pulse 66 are each displaced by a second time expansion DT2 which in the present example is 30 ns. Rectangular pulse 66 is therefore expanded symmetrically from 20 ns pulse width to 80 ns pulse width. It should be understood that the second time expansion DT2 is used whenever the rectangular pulse produced by amplitude detector 28 has pulse width less than or equal to 30 ns, denoted as $W_B$. A second time expansion is included in the preferred embodiment of the pesent invention so that gating pulses resulting from rectangular pulses having pulse widths less than $W_B$ will be expanded so as to be closer to the 90 ns nominal pulse width $W_0$ rather than to the 50 ns pulse width $W_A$. As will be explained later, rectangular pulse 66 is produced to have a pulse width at least equal to 15 ns, denoted as $W_m$. It should also be noted that if rectangular pulse 66 had a pulse width substantially equal to 30 ns, the resulting gating pulse would have essentially a 90 ns (or nominal) pulse width.

Figure 2B:
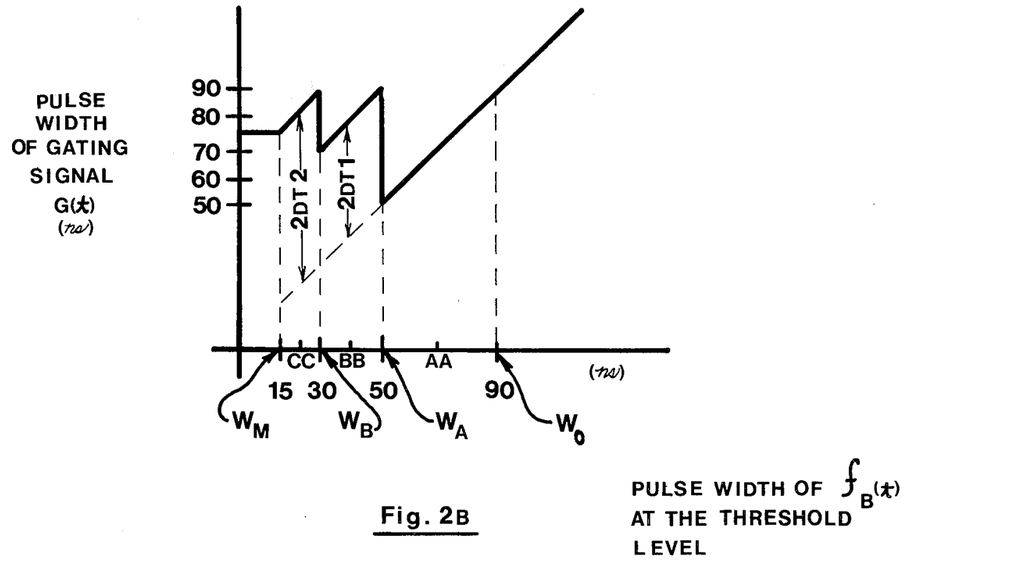
FIG. 2B is a plot of the time duration of the input pulse signal at the threshold level versus time duration of the resulting gating pulses produced by the gate generator circuit of the present invention.

FIG. 2B is an alternative depiction of the operation of gate generator 16 wherein the horizontal scale represents the pulse widths of pulses in readback signal $f_B(t)$ produced at the output of block 12 in FIG. 1 and the vertical scale represents the resulting time durations of the gating pulses of gating signal G(t) produced at the output of pulse width expander 30. With reference to FIG. 2B, when a pulse of signal $f_B(t)$, for example, has a pulse width of AA ns which is greater than $W_A$, the resulting pulse of gating signal G(t) also has pulse width of AA ns. When the pulse of signal $f_B(t)$ has pulse width of BB ns which is less than or equal to $W_A$ and greater than $W_B$, the resulting gating pulse is produced by expanding the detected pulse width of signal $f_B(t)$ by twice DT1. Finally, when pulse of signal $f_B(t)$ has pulse width of CC ns which is less than or equal to $W_B$ and greater than $W_m$, the resulting gating pulse is produced by expanding the detected pulse width of the signal $f_B(t)$ pulse by twice DT2. When the pulse of $f_B(t)$ has pulse width less than $W_m$, the resulting gating pulse is produced with a fixed minimum pulse width.

Figure 3:
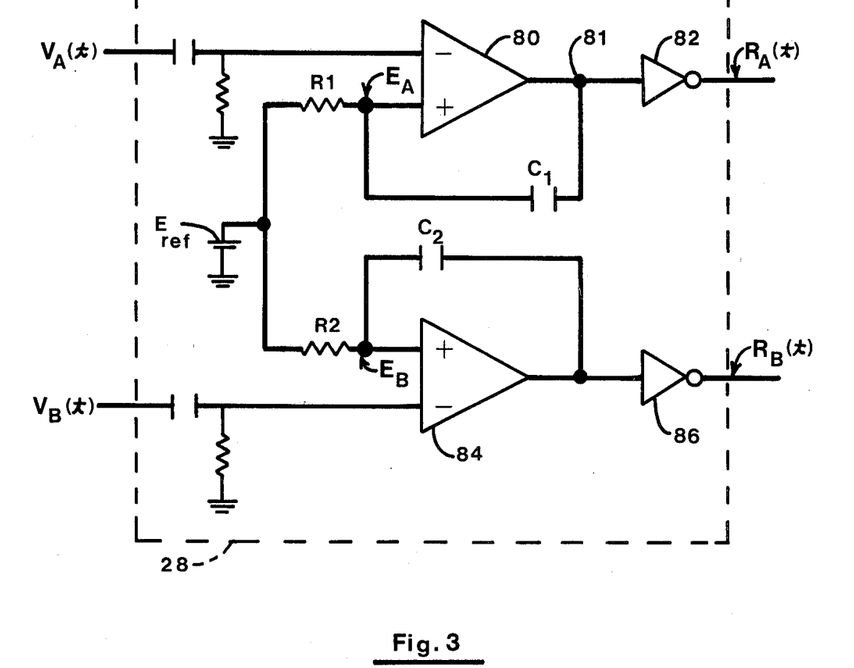
FIG. 3 is an electrical schematic of the AC hysteresis amplitude detector included in FIG. 1.
Figure 4:
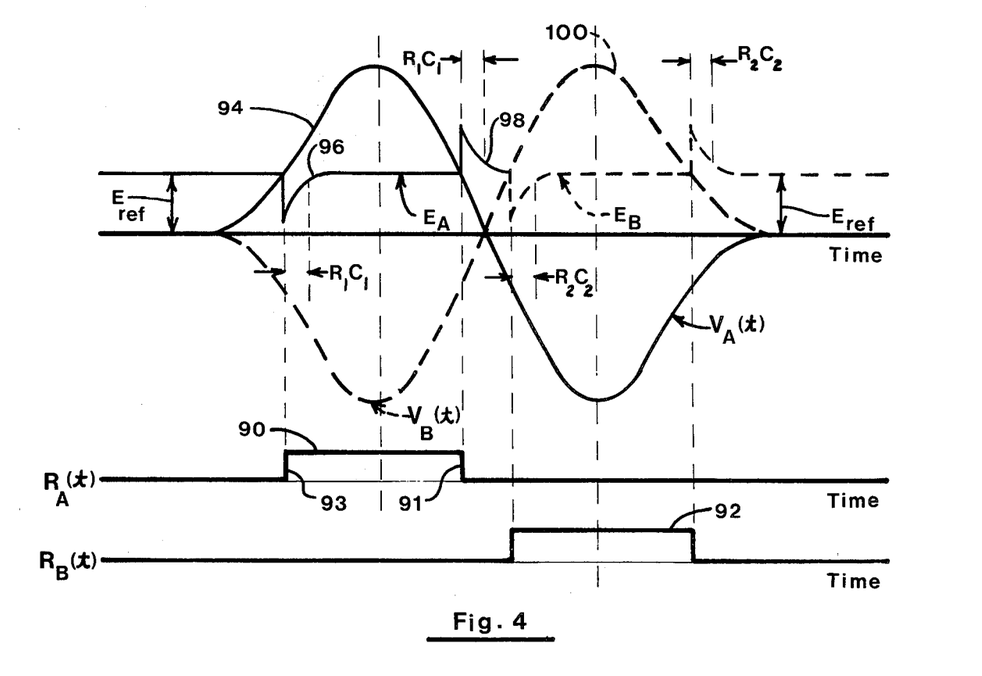
FIG. 4 depicts waveforms which are useful for explaining and understanding the operation of the AC hysteresis amplitude detector shown in FIG. 3.

A detailed discussion of the operation and circuit configuration of AC hysteresis amplitude detector 28 will now be presented in connection with FIGS. 1, 3 and 4. With reference to FIG. 1, since both leads from transducer 10 are shown coupled to block 12, a so called dual ended signal, designated $V_A(t)$ and $V_B(t)$, is produced by block 12. Signal $V_A(t)$ and $V_B(t)$ are mirror images of one another as is well known in the prior art. With reference to FIGS. 3 and 4, signal $V_A(t)$ is applied to the negative input terminal of comparator 80 which is typically a high input impedance and high gain differential amplifier operating in conventional manner as a comparator. Potential means $E_{ref}$ applies a threshold voltage $E_A$ to the positive input terminal of comparator 80. The threshold voltage appearing at the positive input initially builds up to a magnitude equal to $E_{ref}$ at a time when no signal appears at the negative input terminal. The functions of resistor $R_1$ and capacitor $C_1$ will be discussed later so as to simplify the present explanation. The output at terminal 81 of comparator 80 is a signal having two levels, a high level corresponding to the situation where input signal $V_A(t)$ applied at the negative input terminal is less than $E_A$ and a low level corresponding to the situation where the input signal at the negative input terminal exceeds $E_A$. At the instant that the input signal at the negative input terminal equals $E_A$, the output of comparator 80 abruptly switches from one level to the other; i.e., from high to low or from low to high corresponding to the respective situations where a pulse of signal $V_A(t)$ is increasing in amplitude to a peak or decreasing in amplitude from a peak. Thus, comparator 80 operates to clip the pulse of signal $V_A(t)$ whenever the pulse has a peak greater than the $E_{ref}$ voltage level and to amplify greatly the resultant clipped portion of the pulse such that the output pulse produced by comparator 80 has a substantially rectangular waveshape having vertical leading and trailing edges. The output of comparator 80 is then coupled to the input of inverter 82 which functions in conventional manner to invert the received signal pulse to produce signal $R_A(t)$ having substantially rectangular waveshape.

FIG. 3 shows signal $V_B(t)$ applied to the minus input terminal of comparator 84 and inverter 86 coupled to receive the output signal produced by comparator 84. Comparator 84 and inverter 86 operate in the same manner as described for comparator 80 and inverter 82. In FIG. 4 the locations along a time baseline of the alternating positive-going and negative-going peaks of signal $V_A(t)$ represent data. Amplitude detector 28 is designed to operate so that the positive peaks of signal $V_A(t)$ are detected by comparator 80 while the negative peaks of signal $V_A(t)$ are detected by detecting the corresponding positive peaks of signal $V_B(t)$ when applied to comparator 84. It will be recalled that signal $V_B(t)$ is the mirror image of signal $V_A(t)$. Accordingly, the negative peak of signal $V_A(t)$ is the same as the positive peak of signal $V_B(t)$. The circuit depicted in FIG. 3 is the preferred arrangement for amplitude detector 28 because the same reference threshold (that is, potential means $E_{ref}$) is applied to both comparators 80 and 84. If amplitude detector 28 was arranged to detect both positive and negative peaks of signal $V_A(t)$, the reference thresholds applied to each comparator would have to be equal in magnitude and opposite in polarity with respect to one another. The preferred arrangement has an advantage in that the performance of two comparators are easier to match if the same polarity voltage threshold is used for each comparator than if opposite polarity thresholds are used. This arrangement also ensures that the rectangular pulses in $R_A(t)$ and $R_B(t)$ are separated wide enough so that after pulse width expansion, the expanded pulses do not overlap each other. The circuit depicted in FIG. 3 is known as a balanced circuit because the single-ended signals $V_A(t)$ and $V_B(t)$ are applied to separate balanced portions of the circuit in order to produce signal R(t) comprising signals $R_A(t)$ and $R_B(t)$.

Resistors $R_1$ and $R_2$ and capacitors $C_1$ and $C_2$ coupled respectively to comparators 80 and 84 operate to insure that the pulse width of each rectangular pulse in signals $R_A(t)$ and $R_B(t)$ has at least a prescribed minimum time duration. Pulse width expander 30 requires an input pulse of signal $R_A(t)$ or $R_B(t)$ to have a prescribed minimum time duration (15 ns for the illustrative case) in order for expander 30 to operate properly without circuit transients acting to produce non-linear results. With reference to FIGS. 3 and 4, it will be recalled that threshold voltage $E_A$ is initially equal to $E_{ref}$ when signal $V_A(t)$ is absent and the output level of comparator 80 is high which results in the low level of signal $R_A(t)$ at the output of inverter 82. The situation remains unchanged until pulse 94 of signal $V_A(t)$ equals the $E_{ref}$ voltage level. At such time, the output level of comparator 80 abruptly changes from high to low thereby producing leading (positive) edge 93 of pulse 90 in signal $R_A(t)$. Since capacitor $C_1$ is coupled across the output and the positive input of comparator 80, the threshold voltage $E_A$ must also change from $E_{ref}$ to a lower voltage level in response to the abrupt change at the output of comparator 80. A potential difference is created across resistor $R_1$ resulting in a current which will charge capacitor $C_1$ at an exponential rate shown by curve 96. Since the charging time constant for curve 96 is equal to $R_1C_1$, the values of resistor $R_1$ and capacitor $C_1$ can be chosen such that for a predetermined minimum pulse of signal $V_A(t)$ which has a peak just exceeding the $E_{ref}$ threshold voltage level the resulting rectangular pulse in signal $R_A(t)$ will be produced to have the prescribed minimum time duration of 15 ns. It should be noted for pulse 94 of signal $V_A(t)$ depicted in FIG. 3 that the threshold voltage $E_A$ will eventually rise to equal $E_{ref}$. As shown in FIG. 4 when the trailing (negative) portion of pulse 94 first crosses the $E_A$ threshold voltage line, the output of comparator 80 abruptly changes from low to high thereby producing trailing (negative) edge 91 of pulse 90 in signal $R_A(t)$ which is produced at the output of inverter 82. Concurrently, the threshold voltage $E_A$ abruptly changes from the $E_{ref}$ level to a higher voltage level in response to the abrupt change at the output of comparator 80. Accordingly, current flows through resistor $R_1$ and acts to discharge capacitor $C_1$ as shown by curve 98. Curve 98 has a discharge time constant equal to $R_1C_1$ which is equal in magnitude to the charging time constant since the same resistor and capacitor components are used for charging or discharging the capacitor. It should be further noted that resistor $R_1$ and capacitor $C_1$ also serve to provide some insulation from noise peaks in signal $V_A(t)$ from adversely affecting signal $R_A(t)$. As further explanation, in the leading or trailing portions of pulse 94 where threshold voltage $E_A$ follows charging curve 96 or discharging curve 98, noise peaks occurring in such portions of pulse 94 are likely to be precluded from crossing the threshold voltage line for $E_A$. As a result, the leading and trailing edges of pulse 90 of signal $R_A(t)$ are likely to be produced only when pulse 94 first crosses and recrosses threshold voltage line for $E_A$.

The operation of comparator 84, inverter 86, resistor $R_2$ and capacitor $C_2$ to produce pulse 92 in signal $R_B(t)$ in response to pulse 100 in signal $V_B(t)$ is the same at that described above to produced pulse 90 of signal $R_A(t)$ in response to pulse 94 of signal $V_A(t)$. As will be appreciated, resistors $R_1$ and $R_2$ are equal in value and capacitors $C_1$ and $C_2$ are also equal in value.

Figure 5:
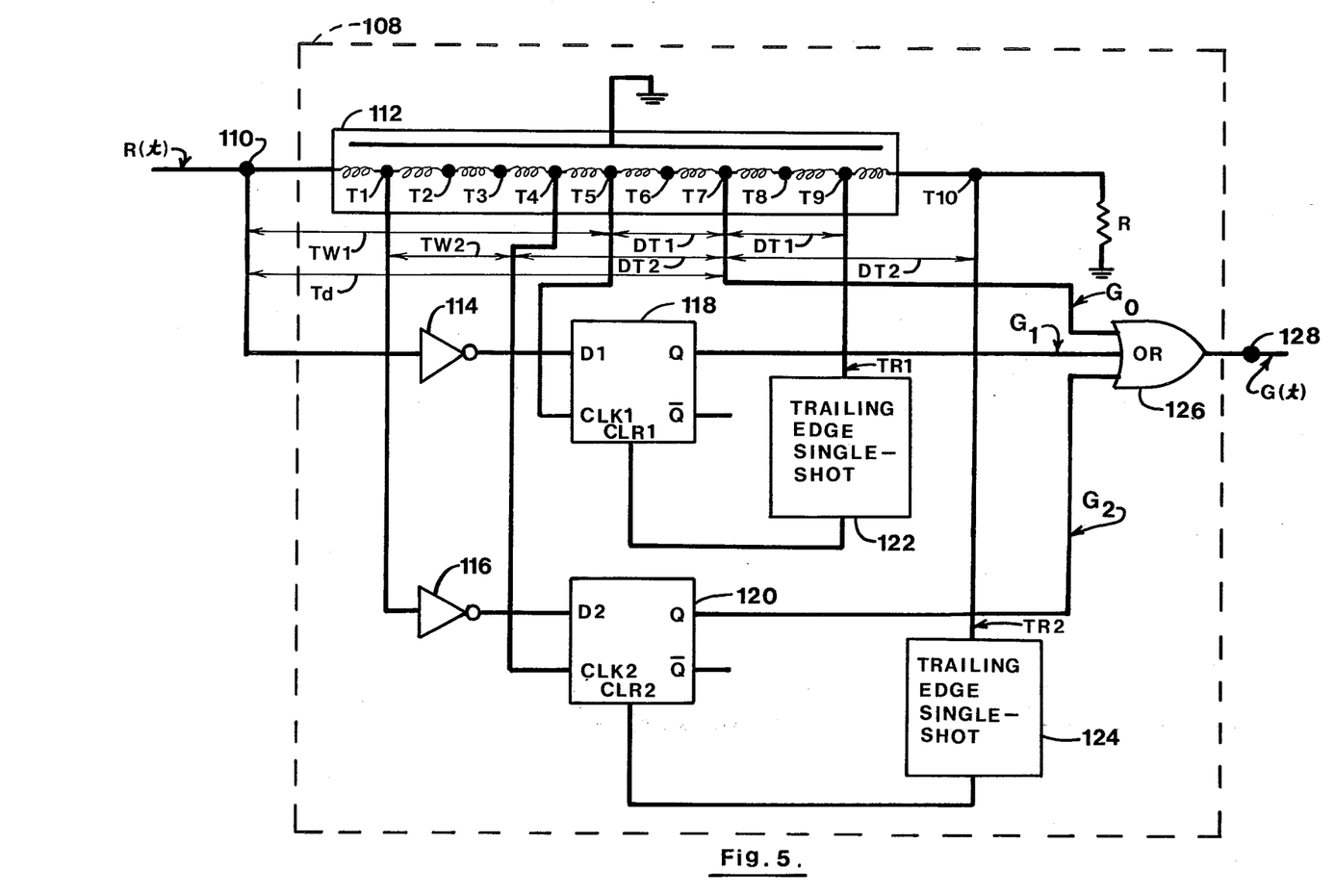
FIG. 5 is an electrical schematic of the symmetrical pulse width expander portion of the gate generator circuit of the present invention.

The detailed circuit configuration and description of operation of symmetrical pulse width expander 30 will now be presented with reference to FIGS. 5, 6A, 6B and 6C. As before, quantitative values have been included in the following discussion for ease of illustration and explanation. Pulse width expander 30 includes circuit 108 which is depicted in FIG. 5. Circuit 108, coupled to receive at input lead 110 rectangular pulse signal R(t) produced by amplitude detector 28, comprises tapped delay line 112, inverters 114 and 116, flip-flop circuits 118 and 120, single-shot circuits 122 and 124, and OR gate 126 all operating in conventional fashion to produce at output terminal 128 gating signal G(t). Delay line 112 has ten taps T1 through T10 each preferably representing a 10 ns time delay. Rectangular pulse 51 in FIG. 6A having 80 ns time duration when applied to input terminal 110 subsequently appears at OR gate 126 as a pulse in $G_0$ having the same pulse width as pulse 51 but delayed 70 ns in time duration. Another input to OR gate 126 is $G_1$. The initial state of $G_1$ is low because flip-flop 118 is initially unlatched before the application of pulse 51. Moreover, before the application of pulse 51 to input lead 110, the initial status of D1 is high because inverter 114 has inverted the initially low level of signal R(t) to a high level. However, upon the application of pulse 51 to lead 110 the status of D1 changes from high to low for 80 ns (which is the pulse width of pulse 51). It should be noted that the level of D1 is opposite in polarity and coincident in time with pulse 51. Positive (leading) edge 55 of pulse 51 passes through delay line 112 and appears at T5 delayed 50 ns to flip flip-flop 118. At such time D1 is still at low level so the $G_1$ output of flip-flop 118 remains at low level. It should be understood that single shot 122 operates only in response to a trailing (negative) edge; i.e., when the level at TR1 changes from high to low. Accordingly, positive edge 55 of pulse 51 which acts to change the level at TR1 from low to high has no affect on single-shot 122. Trailing (negative) edge 53 of pulse 51 appears at T9, delayed 170 ns (the 80 ns time duration of pulse 51 plus the 90 ns delay due to delay line 112) from the time leading edge 55 is applied to lead 110, to change the level at CLR1 from low to high for a short time duration $S_1$ as controlled by single-shot circuit 122. However, it will be recalled that the output of flip-flop 118 is at low level so the positive edge of the signal at CLR1 which resets flip-flop 118 results in no change of level in $G_1$. The level of $G_1$ therefore remains low at all times. Similarly, the level of $G_2$ remains low at all times. As further explanation, flip-flop 120 is initially unlatched so the level of $G_2$ is initially low at the time pulse 51 is applied to delay line 112. D2 initially at high level changes to low level when positive edge 55 of pulse 51 appears at T1. When the positive edge of pulse 51 appears at T4, the level at CLK2 changes from low to high which results in a latching of flip-flop 120. At such latching the level at D2 is still low so that the level of $G_2$ remains low. When the positive edge appears at T10, the level at TR2 changes from low to high level but such change will not affect single-shot 124. When negative edge 53 of pulse 51 appears at T10, the level at CLR2 changes from low to high for a short time duration $S_2$ as controlled by single-shot 124. Such changes causes the resetting (unlatching) of flip-flop 120. However, since the output of flip-flop 120 was already low, such unlatching will not change the low level of $G_2$. The level of $G_2$ therefore remains low at all times. As a result of the above, pulse 51 is passed through circuit 108 unchanged in pulse width and appears at output terminal 128 as signal G(t) delayed 70 ns from the time it is applied to input lead 110.

Figure 6A:
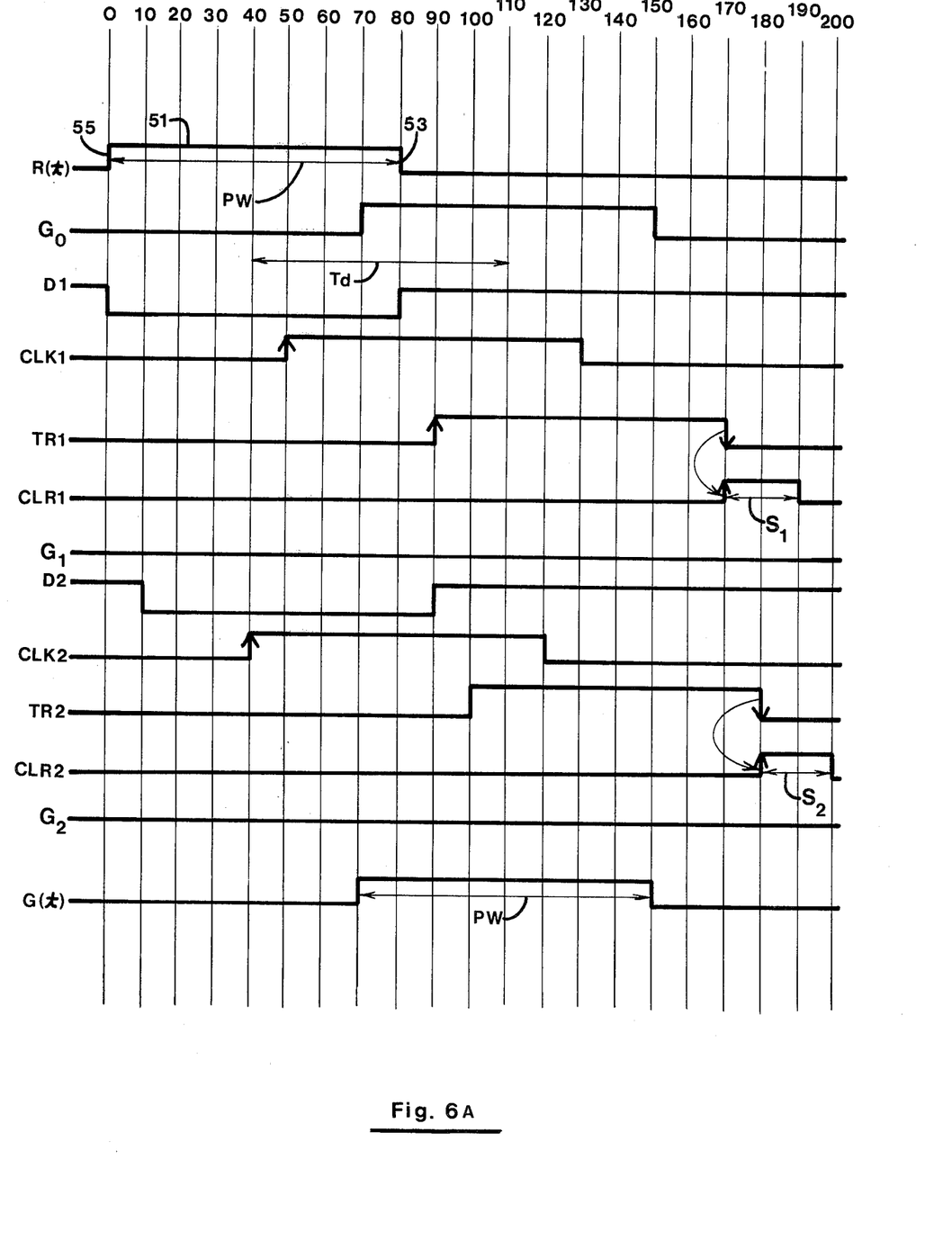
FIGS. 6A-B-C depict waveforms which are useful in explaining and understanding the operation of the symmetrical pulse width expander shown in FIG. 5.
Figure 6B:
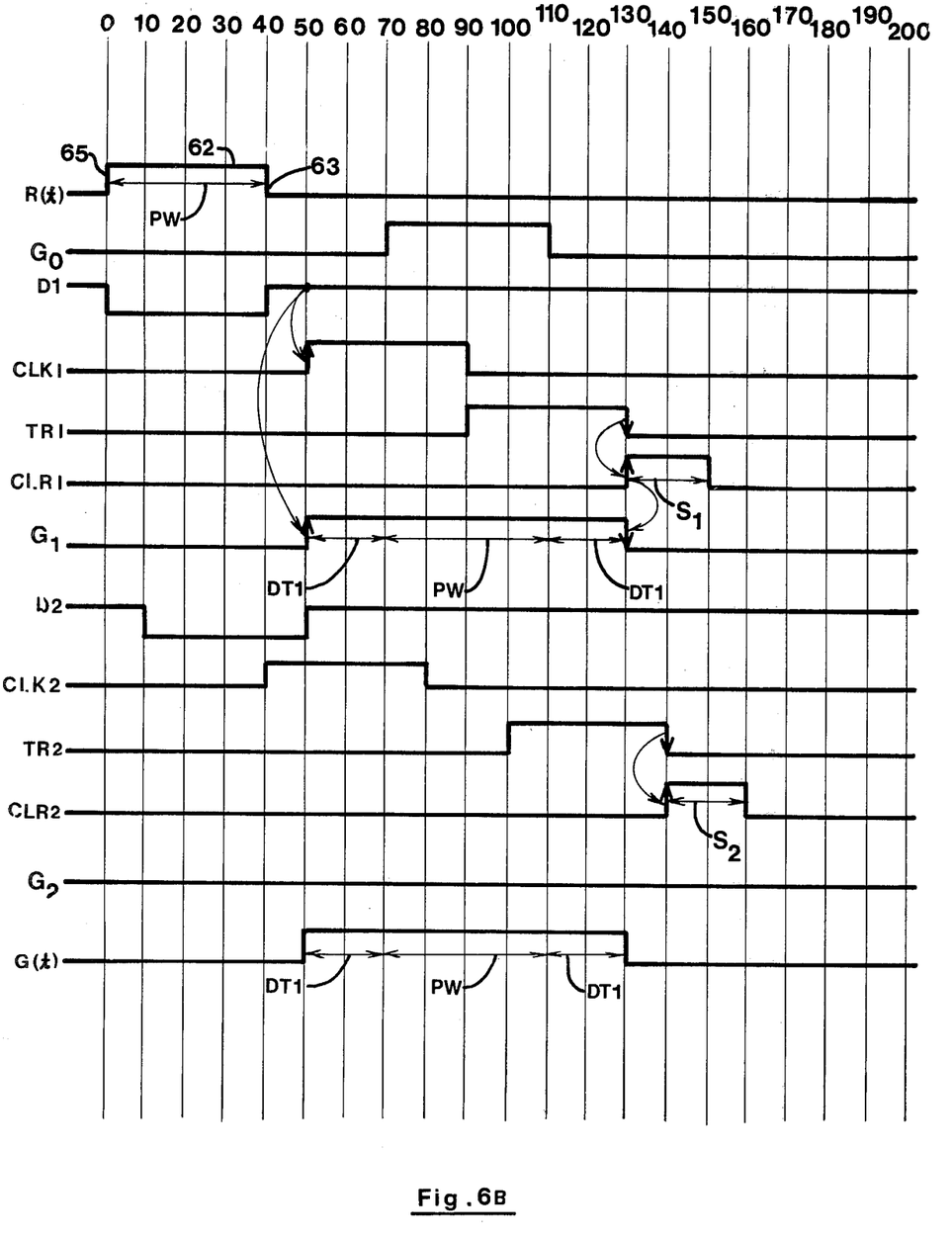

Rectangular pulse 62 is shown in FIG. 6B to have a 40 ns pulse width. In a similar manner as previously described, when pulse 62 is applied to input lead 110, it subsequently appars at OR gate 126 as a pulse in $G_0$ having the same pulse width as pulse 62 but time delayed 70 ns. Before the application of pulse 62, the level of $G_1$ is low and the level at D1 is high. Upon the application of pulse 62 to circuit 108, the level at D1 changes from high to low for the 40 ns time duration of pulse 62 and thereafter reverts to high. Since the level at D1 has reverted to high by the time the positive edge 65 of pulse 62 appears at T5 to change the level of CLK1 from low to high and latch flip-flop 118, the level of $G_1$ changes from low to high. When positive edge 65 appears at T9, the level at TR1 changes from low to high but such change will not affect single-shot 122. When negative edge 63 of pulse 62 appears at T9, the level at TR1 changes from high to low which causes the level at CLR1 to change from low to high for a short time duration $S_1$ and results in flip-flop 118 being unlatched. Such unlatching changes the output of flip-flop 118 so that the level of $G_1$ changes from high to low. As a result, the positive and negative edges of the pulse produced in $G_1$ appear at OR gate 126 with respective delays of 50 ns (due to delay line 112) and 130 ns (90 ns due to delay line 112 plus the 40 ns time duration of pulse 62) from the time leading edge 65 of pulse 62 is applied to the input lead 110, thereby resulting in a pulse width of 80 ns which represents an expansion of pulse 62 by 40 ns. Therefore, since the positive edge of the pulse in $G_0$ is delayed 70 ns from the time of the initial application of pulse 62 to input lead 110 and the positive edge of the pulse in $G_1$ is delayed 50 ns, the latter positive edge occurs 20 ns (or DT1) earlier than the former positive edge. In addition, the negative edge of the pulse in $G_0$ is 70 ns delayed and the negative edge of the pulse in $G_1$ is 90 ns delayed respectively from the negative edge 63 of pulse 62 so that the latter negative edge occurs 20 ns (or DT1) later than the former negative edge. It will be recalled that the pulse in $G_0$ has pulse width equal to that for pulse 62 or 40 ns. Accordingly, the pulse in $G_1$ is a symmetrical expansion of pulse 62 about its midpoint by 40 ns or twice DT1. From a consideration of the remaining waveshapes shown in FIG. 6B produced by circuit 108, the level of $G_2$ remains low throughout the time period for processing pulse 62. Consequently, the pulse produced by OR gate 126 in signal G(t) is the same as the pulse in $G_1$ and the pulse in $G_0$ can be ignored since such pulse is contained entirely within the pulse in $G_1$.

Figure 6C:
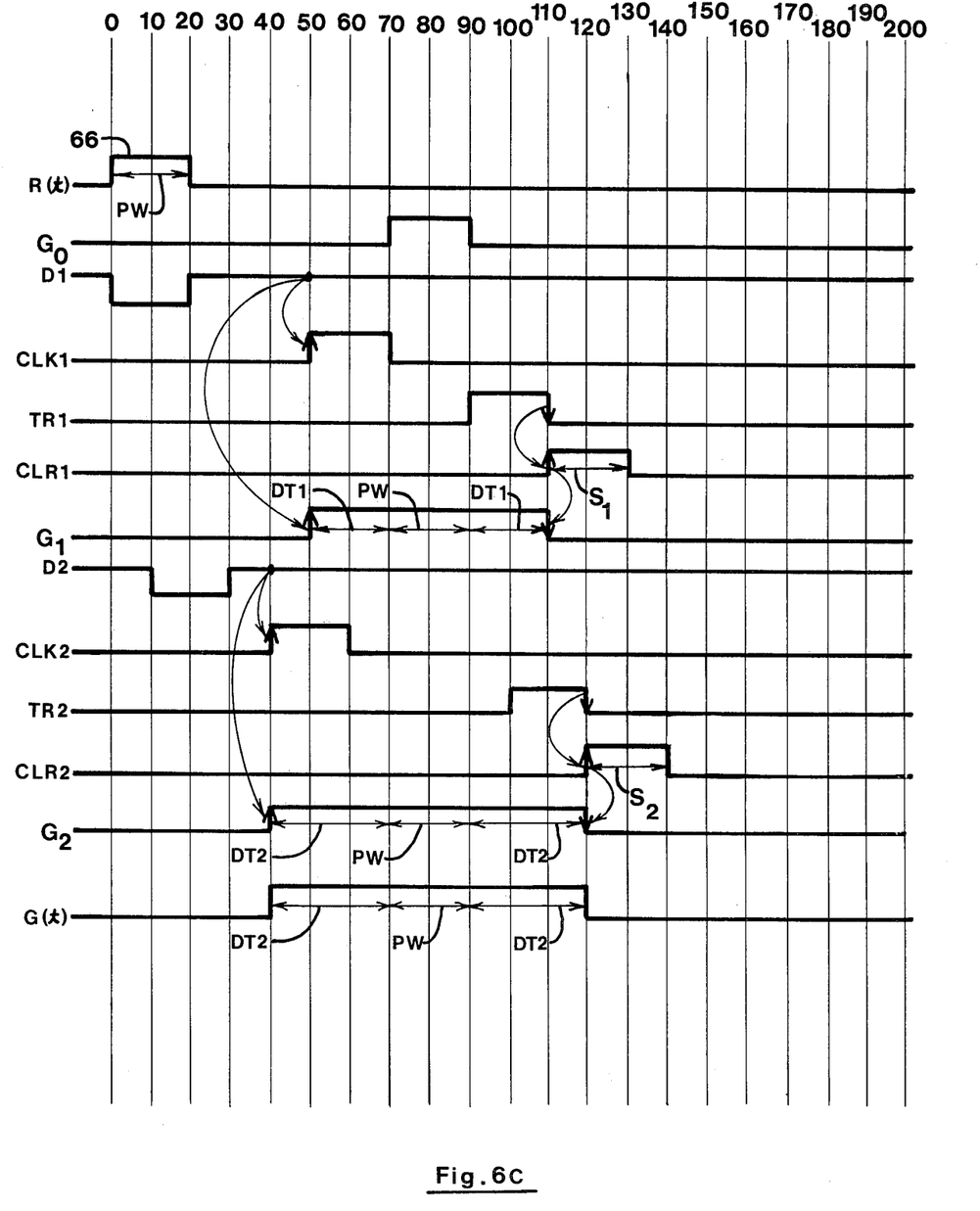

Rectangular pulse 66 is shown in FIG. 6C to have a 20 ns pulse width. When pulse 66 is applied to circuit 108, a pulse is produced in $G_0$ equal in pulse width to that for pulse 66. A pulse is also produced in $G_1$ having pulse width of 60 ns; that is, 20 ns time duration of pulse 66 plus the 40 ns (twice DT1) expansion of pulse 66. The manner in which the pulses are produced in $G_0$ and $G_1$ is similar to that previously described when pulse 62 was applied to circuit 108 to produce pulses in $G_0$ and $G_1$. However, in the situation depicted in FIG. 6C, a pulse is also produced in $G_2$. The positive edge of the pulse in $G_2$ can be shown to appear at OR gate 126 delayed 40 ns from the time of the initial application of pulse 66 to circuit 108. Moreover, the negative edge of the pulse in $G_2$ can be shown to appear at OR gate 126 delayed 120 ns from the time of the initial application of pulse 66 thereby resulting in the pulse in $G_2$ having a 80 ns pulse width which represents an expansion of pulse 66 by 60 ns. As can be seen from a consideration of the circuit shown in FIG. 5 and the waveforms in FIG. 6C, the 80 ns pulse is a result of symmetrical expansion of pulse 66 about its midpoint by an interval equal to twice DT2 (or 60 ns). As a result, the pulse produced by OR gate 126 in signal G(t) is the same as the pulse in $G_2$ and the pulses in $G_0$ and $G_1$ can be ignored since they are contained entirely within the pulse in $G_2$.

It can be understood from the above illustrations involving pulses 51, 62 and 66 that if an input pulse of signal R(t) has a time duration greater than 50 ns (TW1 shown in FIG. 5), circuit 108 operates to produce an output pulse in signal G(t) being the same as the pulse in $G_0$ (that is, the output pulse has a time duration the same as that for the input pulse) with the midpoint of such output pulse delayed 70 ns (Td in FIGS. 5 and 6A) from the time when the midpoint of the input pulse appeared at the input lead 110 of circuit 108. Further, if an input pulse of signal R(t) has a time duration less than or equal to 50 ns (TW1 in FIG. 5) and greater than 30 ns (TW2 in FIG. 5), circuit 108 operates to produce a pulse in signal G(t) being the same as the pulse in $G_1$ (that is, the output pulse has a time duration equal to that for the input pulse plus twice DT1) with the midpoint of such output pulse delayed 70 ns from the midpoint of the input pulse. Finally, if an input pulse of signal R(t) has a time duration less than or equal to 30 ns (TW2 in FIG. 5), circuit 108 operates to produce a pulse in signal G(t) being the same as the pulse in $G_2$ (that is, the output pulse has a time duration equal to that for the input pulse plus twice DT2) with the midpoint of such output pulse delayed 70 ns from the midpoint of the input pulse. It will be recalled that amplitude detector 28 produces a rectangular pulse in signal R(t) with pulse width at least equal to 15 ns. Accordingly, the minimum pulse width of signal G(t) is 75 ns (15 ns plus twice DT2).

Figure 7:
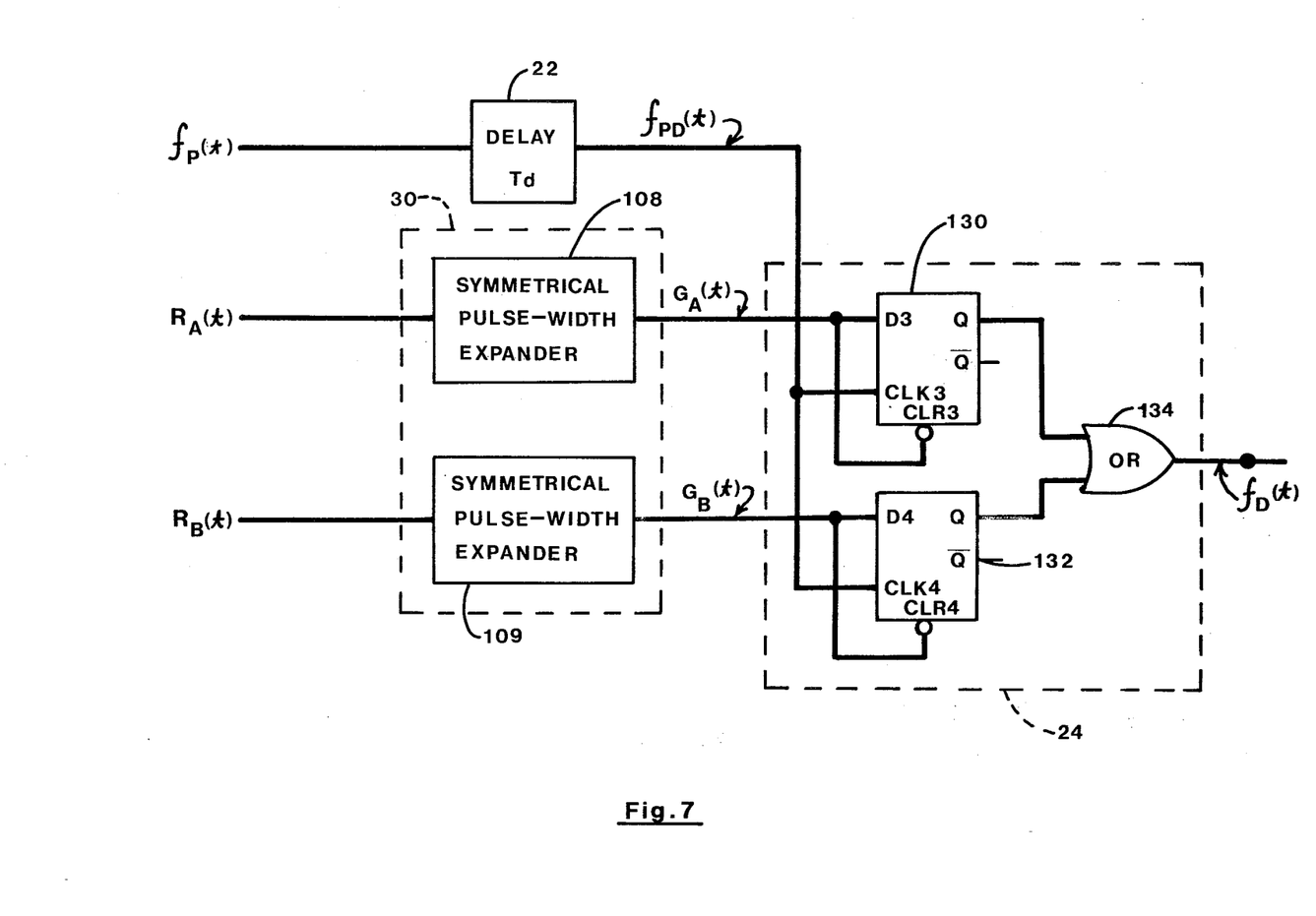
FIG. 7 is a block diagram depicting a preferred embodiment of the symmetrical pulse width expander of the present invention and the gating logic block included in FIG. 1.

FIG. 7 depicts the preferred embodiment of expander 30 which comprises circuits 108 and 109 coupled to receive respectively signals $R_A(t)$ and $R_B(t)$ produced by amplitude detector 28. Circuits 108 and 109 are matched (balanced) with one another in order to preserve the timing relationship between the single ended signals $G_A(t)$ and $G_B(t)$ produced at the output of expander 30. Gating logic 24 operates in conventional manner and comprises flip-flops 130 and 132 coupled to receive signals $G_A(t)$, $G_B(t)$ and $f_{PD}(t)$ and OR gate 134 for producing data representative signal $f_D(t)$. It will be noted that only a portion of peak detector 14 is shown in FIG. 7 and it will be recalled that signal $f_p(t)$ is produced in peak detector 14. Delay circuit 22 delays the pulses in signal $f_p(t)$ by 70 ns (or Td) before they are combined with the respective gating pulses in signals $G_A(t)$ and $G_B(t)$. Therefore after the delay, the noise contaminated data representative pulses in $f_P(t)$ are aligned to the midpoints of the gating pulses in G(t). By means of the latching characteristics of the flip flops 130 and 132, the first pulse of $f_{PD}(t)$ inside the gate G(t) is gated out as the true data representative pulse.

While the present invention has been described with reference to a preferred embodiment, it will be apparent that improvements and modifications may be made within the purview of the invention without departing from the true spirit and scope thereof as defined in the appended claims.

I claim:

1. A gate generator circuit for producing gating pulses in response to a pulse type input signal, wherein the locations of the pulse peaks of the input signal are representative of data, said gate generator circuit comprising:

amplitude detector means for converting to a rectangular pulse each pulse of the input signal which exceeds a predetermined amplitude threshold, said rectangular pulse having positive and negative edges; and pulse expander means coupled to said amplitude detector means and responsive to the rectangular pulses for producing the gating pulses by transmitting each rectangular pulse unchanged in pulse width in a first case where the pulse width of each rectangular pulse is greater than a predetermined time duration, and by expanding by a predetermined amount each end of each rectangular pulse in a second case where the pulse width of each rectangular pulse is less than or equal to the predetermined time duration.

2. The gate generator circuit of claim 1 wherein said amplitude detector means includes integrator means coupled thereto, said integrator means acting to control said predetermined amplitude threshold abruptly in a prescribed manner to assure that each rectangular pulse produced by said amplitude detector means has at least a specified minimum pulse width.

3. The gate generator circuit of claim 1 wherein said pulse expander means includes delay line means coupled for receiving the rectangular pulses, said delay line means having an input terminal and a series of intermediate output taps and being operative for delaying each rectangular pulse so that it appears successively at said taps with successively increasing time delays, and logic circuit means coupled to selected taps of said delay line means and so constructed and arranged that each gating pulse is produced therefrom in said first case by passing through said logic circuit means an unchanged rectangular pulse which is the rectangular pulse received from and delayed by said delay line means for a prescribed time delay, and in said second case by combining the positive edge of the rectangular pulse which has been received from and delayed by said delay line means for an interval shorter than said prescribed time delay with the negative edge of the rectangular pulse which has been received from and delayed by said delay line means for an interval longer than said prescribed time delay thereby forming a symmetrically expanded rectangular pulse where the midpoint thereof is delayed for said prescribed time delay.

4. The gate generator circuit of claim 1 wherein said amplitude detector means includes comparator means having an input for receiving the input pulse type signal and responding to each pulse of the input signal exceeding the predetermined amplitude threshold to produce each said rectangular pulse.

5. The circuit in claim 4 wherein said amplitude detector means includes integrator means coupled thereto, said integrator means acting to control said predetermined amplitude threshold abruptly in a prescribed manner to assure that each rectangular pulse produced by said amplitude detector means has at least a specified minimum pulse width.

6. The circuit of claim 5 wherein said pulse expander means includes delay line means coupled for receiving the rectangular pulses, said delay line means having an input terminal and a series of intermediate output taps and being operative for delaying each rectangular pulse so that it appears successively at said taps with successively increasing time delays, and logic circuit means coupled to selected taps of said delay line means and so constructed and arranged that each gating pulse is produced therefrom in said first case by passing through said logic circuit means an unchanged rectangular pulse which is the rectangular pulse received from and delayed by said delay line means for a prescribed time delay, and in said second case by combining the positive edge of the rectangular pulse which has been received from and delayed by said delay line means for an interval shorter than said prescribed time delay with the negative edge of the rectangular pulse which has been received from and delayed by said delay line means for an interval longer than said prescribed time delay thereby forming a symmetrically expanded rectangular pulse where the midpoint thereof is delayed for said prescribed time delay.

7. The circuit of claim 6 wherein said logic circuit means in said second case is operative for generating intermediate rectangular pulses comprising said symmetrically expanded rectangular pulse and said unchanged rectangular pulse, said intermediate rectangular pulses having coinciding midpoints which have been delayed by said delay line means for said prescribed time delay, and said logic circuit means includes means coupled for receiving and arranged for logically combining said intermediate pulses so that said gating pulse produced by said pulse expander means is the symmetrically expanded rectangular pulse.

8. The circuit of claim 7 wherein said pulse expander means is so constructed and arranged that in a third case where the pulse width of the rectangular pulse received from said amplitude detector means is less than or equal to a second predetermined time duration which is smaller than said first mentioned predetermined time duration, said logic circuit is operative to produce as said gating pulse a second symmetrically expanded rectangular pulse having a pulse width larger than that for said first mentioned symmetrically expanded rectangular pulse and a midpoint thereof delayed for said prescribed time delay.

9. The circuit of claim 8 wherein said logic circuit means in said third case is operative for generating second intermediate rectangular pulses comprising said first mentioned intermediate rectangular pulses and said second symmetrically expanded rectangular pulse, said second symmetrically expanded rectangular pulse having a midpoint which coincides with the midpoints of said first intermediate rectangular pulses, and said means in third case when receiving said second intermediate pulses being operative for producing as said gating pulse the second symmetrically expanded rectangular pulse.

10. The circuit of claim 9 wherein said pulse expander means comprises balanced expander circuits having input terminals coupled to receive the rectangular pulses from the amplitude detector means.

11. The circuit of claim 9 wherein said amplitude detector means comprises a balanced detector circuit and is responsive to alternating positive and negative pulses of said input signal which exceeds the predetermined amplitude threshold.

12. The circuit of claim 11 wherein said pulse expander means comprises balanced expander circuits having input terminals coupled to receive the rectangular pulses from the amplitude detector means.

13. The circuit of claim 4 wherein said pulse expander means includes delay line means coupled for receiving the rectangular pulses, said delay line means having an input terminal and a series of intermediate output taps and being operative for delaying each rectangular pulse so that it appears successively at said taps with successively increasing time delays, and logic circuit means coupled to selected taps of said delay line means and so constructed and arranged that each gating pulse is produced therefrom in said first case by passing through said logic circuit means an unchanged rectangular pulse which is the rectangular pulse received from and delayed by said delay line means for a prescribed time delay, and in said second case by combining the positive edge of the rectangular pulse which has been received from and delayed by said delay line means for an interval shorter than said prescribed time delay with the negative edge of the rectangular pulse which has been received from and delayed by said delay line means for an interval longer than said prescribed time delay thereby forming a symmetrically expanded rectangular pulse where the midpoint thereof is delayed for said prescribed time delay.

14. The circuit of claim 13 wherein said pulse expander means is so constructed and arranged that in a third case where the pulse width of the rectangular pulse received from said amplitude detector means is less than or equal to a second predetermined time duration which is smaller than said first mentioned predetermined time duration, said logic circuit is operative to produce as said gating pulse a second symmetrically expanded rectangular pulse having a pulse width larger than that for said first mentioned symmetrically expanded rectangular pulse and a midpoint thereof delayed for said prescribed time delay.

15. The circuit of claim 13 wherein said logic circuit means in said second case is operative for generating intermediate rectangular pulses comprising said symmetrically expanded rectangular pulse and said unchanged rectangular pulse, said intermediate rectangular pulses having coinciding midpoints which have been delayed by said delay line means for said prescribed time delay, and said logic circuit means includes means coupled for receiving and arranged for logically combining said intermediate pulses so that said gating pulse produced by said pulse expander means is the symmetrically expanded rectangular pulse.

16. The circuit of claim 15 wherein said pulse expander means is so constructed and arranged that in a third case where the pulse width of the rectangular pulse received from said amplitude detector means is less than or equal to a second predetermined time duration which is smaller than said first mentioned predetermined time duration, said logic circuit is operative to produce as said gating pulse a second symmetrically expanded rectangular pulse having a pulse width larger than that for said first mentioned symmetrically expanded rectangular pulse and a midpoint thereof delayed for said prescribed time delay.

17. The circuit of claim 16 wherein said logic circuit means in said third case is operative for generating second intermediate rectangular pulses comprising said first mentioned intermediate rectangular pulses and said second symmetrically expanded rectangular pulse, said second symmetrically expanded rectangular pulse having a midpoint which coincides with the midpoints of said first intermediate rectangular pulses, and said means in said third case when receiving said second intermediate pulses being operative for producing as said gating pulse the second symmetrically expanded rectangular pulse.

18. The circuit of claim 17 wherein said pulse expander means comprises balanced expander circuits having input terminals coupled to receive the rectangular pulses from the amplitude detector means.

19. The circuit of claim 17 wherein said amplitude detector means comprises a balanced detector circuit and is responsive to alternating positive and negative pulses of said input signal which exceeds the predetermined amplitude threshold.

20. The circuit of claim 19 wherein said pulse expander means comprises balanced expander circuits having input terminals coupled to receive the rectangular pulses from the amplitude detector means.

* * * * *